(12) United States Patent
Lorenzen

(10) Patent No.: US 7,369,589 B2
(45) Date of Patent: May 6, 2008

(54) DIODE LASER SUBELEMENT AND ARRANGEMENTS WITH SUCH DIODE LASER SUBELEMENT

(75) Inventor: Dirk Lorenzen, Jena (DE)

(73) Assignee: Jenoptik Laserdiode GmbH, Jena (DE)

( * ) Notice: Subject to any disclaimer, the term of this patent is extended or adjusted under 35 U.S.C. 154(b) by 310 days.

(21) Appl. No.: 11/021,366

(22) Filed: Dec. 22, 2004

(65) Prior Publication Data
US 2005/0141575 A1    Jun. 30, 2005

(30) Foreign Application Priority Data
Dec. 22, 2003    (DE) ................ 103 61 899

(51) Int. Cl.
*H01S 3/04* (2006.01)
(52) U.S. Cl. .............. 372/36; 372/34; 372/35
(58) Field of Classification Search ............. 372/34–36
See application file for complete search history.

(56) References Cited

U.S. PATENT DOCUMENTS

| | | | |
|---|---|---|---|
| 5,099,488 A * | 3/1992 | Ahrabi et al. ............. | 372/36 |
| 5,105,429 A * | 4/1992 | Mundinger et al. ........... | 372/34 |
| 5,105,430 A | 4/1992 | Mundinger et al. | |
| 5,715,264 A | 2/1998 | Patel et al. | |
| 5,903,583 A * | 5/1999 | Ullman et al. ............... | 372/35 |
| 6,101,206 A | 8/2000 | Apollonov et al. | |
| 6,151,341 A * | 11/2000 | Bull et al. .................... | 372/35 |
| 6,647,035 B1 * | 11/2003 | Freitas et al. ................ | 372/36 |
| 6,804,275 B2 * | 10/2004 | Miyajima et al. ............ | 372/36 |
| 7,145,927 B2 * | 12/2006 | Rice ............................ | 372/36 |
| 2004/0196879 A1 * | 10/2004 | Stephens et al. ............. | 372/36 |

FOREIGN PATENT DOCUMENTS

| | | |
|---|---|---|
| DE | 195 05 302 | 8/1995 |
| DE | 198 21 544 | 12/1999 |
| DE | 199 56 565 | 5/2001 |
| DE | 697 08 247 T2 | 5/2002 |
| DE | 101 13 943 A1 | 10/2002 |
| WO | WO- 96/26560 | 8/1996 |
| WO | WO 97/30494 | 8/1997 |

\* cited by examiner

*Primary Examiner*—Minsun Oh Harvey
*Assistant Examiner*—Phillip Nguyen
(74) *Attorney, Agent, or Firm*—Jordan and Hamburg LLP

(57) ABSTRACT

Expansion-adapted mounting and electrical contacting of laser diode elements are connected with one another in terms of structural engineering such that the laser diode elements can be stacked or arranged laterally in one plane for producing vertical diode laser arrangements with low production complexity. The upper and the lower layers of a heat-distributing multilayer substrate for a diode laser subelement, between which a separating layer is disposed, contain metal strata regions arranged spaced from one another of which for forming strata region pairs each strata region of the upper layer is joined electrically conducting to a strata region of the lower layer. The separating layer contains at least one electrically insulating stratum made of non-metallic material and the sum of the thicknesses of metallic strata in the multilayer substrate exceeds the sum of the thicknesses of non-metallic strata at least in a partial region perpendicular to the mounting surface for at least one laser diode element.

23 Claims, 13 Drawing Sheets

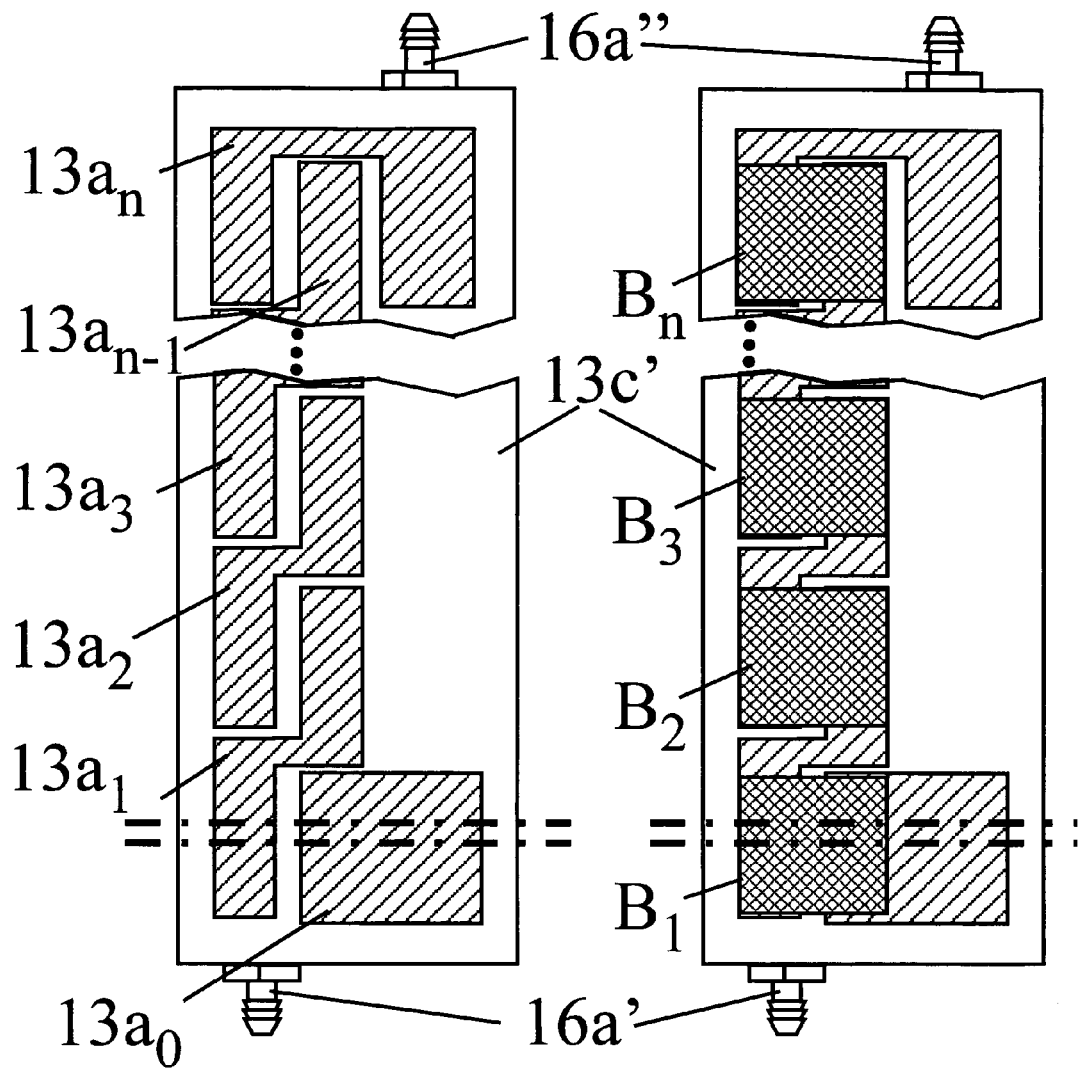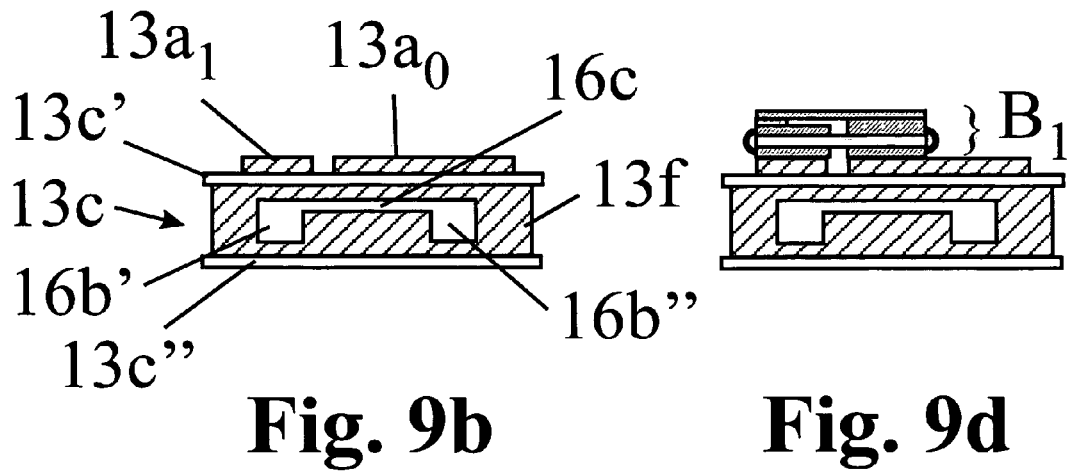
Fig. 9a  Fig. 9c
Fig. 9b  Fig. 9d

DIODE LASER SUBELEMENT AND ARRANGEMENTS WITH SUCH DIODE LASER SUBELEMENT

BACKGROUND OF THE INVENTION

The invention relates to a diode laser subelement with at least one laser diode element applied to a mounting surface of a heat-distributing multilayer substrate, whereby the multilayer substrate is joined materially with one another, made of an upper, a lower, and at least one separating layer interposed therebetween.

Laser diode elements include individual laser diodes and laser diode bars. Individual laser diodes have only a single laser diode emitter that is defined by an optically continuous active area. Laser diode bars are monolithic semiconductor laser arrangements of at least two operational laser diode emitters that are optically largely independent of one another. The lateral reach of laser diode bars is a factor of the width, spacing, and number of emitters. Typical widths are in the range of 1 to 15 mm.

For reliable operation as a diode laser, the laser diode elements are mounted on a heatsink that distributes, and, in the case of microchannel coolers, also carries off, heat loss. The upper side of the heatsink is defined in that it contains the surface for assembling the laser diode element.

It is known that two essential conditions must be observed for reliable solder mounting of laser diode bars on heatsinks: (a) the use of hard soldering or performing diffusion soldering with isothermal solidification and (b) the use of a heatsink, the thermal expansion coefficient of which corresponds to that of the laser diode material to approximately 1 ppm/K in order to attain minimum stress soldering of the laser diode bar, which is relatively wide in comparison to the individual laser diodes.

In particular for high-performance laser diodes with a GaAs basis (i.e., the epitaxy of which is performed on a GaAs substrate), special heatsink embodiments must be found because the highly heat-conductive materials that are suitable for cooling either have thermal expansion coefficients that are too low (aluminum nitride, silicon carbide, boron nitride, and diamond are at least 2 ppm/K below the value for GaAs of 6.5 ppm/K) or too high (aluminum, gold, copper, silver are at least 6 ppm/K above the value for GaAs).

The same is true for sapphire-based laser diode bars with GaN epitaxy and for zinc selenide-based laser diode bars.

Also known is designing heatsinks with high thermal conductivity with a thermal expansion coefficient that corresponds to that of the laser substrate material (GaAs, sapphire, GaP, GaSb, ZnSe) using a multilayer structure with layers made of materials with higher and lower thermal expansion coefficients. One example is the copper/aluminum nitride/copper system. Such heatsinks can also be embodied as microchannel coolers. In the interest of the lowest possible thermal resistance, recesses and cutouts can be added to the individual strata or layers for varying strata thicknesses.

The known technical solutions largely relate to the thermo-mechanical goal of adjusting the appropriate thermal expansion coefficient and to the thermal goal of optimized cooling. However, one important aspect for the operation and engineering of a diode laser is also power supply for the laser diode bar.

The heatsink is often also one (the first) of the two electrical contacts, because the laser diode must carry off the main heat via one of its poles (anode or cathode). A small secondary amount of heat can be carried off the via the second pole; it then becomes critical when the second electrical contact enters a thermally highly conductive connection, for instance with the heatsink, that already provides the first electrical contact.

In the prior art (DE 101 13 943 A1), a metal film is mounted to the secondary heat elimination side of the laser diode bar. The thermal and mechanical link to the generally larger heatsink (electrical contact of the main heat elimination side) occurs with electrical insulation from the same via a thin electrical insulating stratum that is approximately the thickness of the laser diode bar, for instance made of polyamide or ceramic. Thus there are two joint zones situated between the secondary heat elimination side-electrical feed line, above and below the electrical insulation stratum, which means disadvantageous mounting complexity.

Another disadvantage in known diode lasers relates to providing connection options for electrical contact elements for the electrical supply of the laser diode bar via power cable. As a rule, these electrical connection options are realized in the electrical contact elements as threaded bores that permit the power supply cable to be attached via pole pieces using screws. As has been stated, the main heat elimination side-electrical contact element is a component of the heatsink. In accordance with the prior art, the secondary heat elimination side-electrical contact element is brought into electrical contact with the line that is joined to the laser diode bar on the secondary heat elimination side in a material fit. This occurs either directly in a material fit in that the secondary heat elimination side-electrical contact element is attached only to the line that itself obtains its pull relief via the material-fit mounting to the electrical insulation stratum attached to the heatsink, or indirectly in a force-fit in that the secondary heat elimination side-electrical contact element is screwed to the heatsink or to a third element. In both cases a contact or joint zone occurs that involves disadvantageous mounting complexity. In addition, both the electrical contact of the contacts via pole pieces and screws and a force-fit contact of the contact element to the strip conductor contain an electrical contact resistance, the heat of which should be carried off efficiently during operation.

Another unsatisfactorily addressed object relates to the modular integration of diode laser elements or diode lasers in arrangements of a plurality of diode laser elements or diode lasers. There are numerous suggestions for vertical arrangements (stacks) and lateral arrangements (rows) of diode laser elements, both for conductively cooled substrates and for convectively cooled microchannel heatsinks. While series connection of the diode laser elements is realized in a simple manner in these vertical diode laser arrangements in that the strip conductor, attached to the laser diode bar on the secondary heat elimination side, of a first diode laser element is in direct or indirect electrical contact with the heatsink as a main heat elimination side-electrical contact of a second diode laser component located thereabove, for lateral diode laser arrangements there is the problem of converting the vertical electrical contact element arrangement into a series connection of the diode laser elements that can be arranged laterally. This goal of series connection of lateral diode laser arrangements can be generalized for every planar arrangement of diode laser elements and diode laser stacks.

SUMMARY OF THE INVENTION

Starting at this point, it is the object of the invention to connect the expansion-adapted mounting and the electrical contacting of laser diode elements to one another in terms of structural engineering such that the laser diode elements can be stacked and/or arranged laterally in one plane with low production complexity for producing vertical diode laser arrangements.

This object is achieved in a diode laser subelement of the type cited in the foregoing in that the upper and the lower layers contain metallic strata regions arranged spaced from one another of which for forming strata region pairs each strata region of the upper layer is connected electrically conducting to a strata region of the lower layer such that the separating layer contains at least one electrically insulating stratum made of non-metallic material, and in that the sum of the thicknesses of metallic strata in the multilayer substrate exceeds the sum of the thicknesses of non-metallic strata at least in a partial region perpendicular to the mounting surface.

Different pairs of the electrically conducting connected strata regions are provided for producing electrical contacts to the at least one laser diode element.

In the invention, metallic strata of a heat-distributing multilayer substrate suitable for expansion adaptation are used in both the upper and lower layers to produce electrical connections to the laser diode element and to lead these electrical connections into a common plane. Particularly positive properties result from this, such as surface mountability with simultaneous electrical contacting of inventive diode laser subelements that can be used in particular for diode laser stacks made of diode laser subelements and for lateral arrangements of the surface-mountable diode laser subelements on printed circuit boards.

The inventively produced thickness ratio between metallic and non-metallic strata results with certainty on the surface of at least one of the strata regions of the upper exposed layer in a linear thermal expansion coefficient that clearly deviates from the thermal expansion coefficient of the non-metallic strata and thus is either approximately the mean linear thermal expansion coefficient of the laser diode bar or is greater than it. Thus damaging (too high) tensile stress on the multilayer substrate is avoided when soldering the laser diode element.

The invention furthermore provides expansion-adapted mounting of the laser diode elements on heatsinks and possesses the additional advantage of reducing the number of joint zones during the mounting of the electrical connection elements to a contact of the laser diode element, since the insulator mounting has already taken place during the production of the multilayer substrate by forming at least one separating non-metallic stratum.

In addition, using a positive-fit contact to the heat-distributing multilayer substrate and depending on the heat conductivity of the materials used and on the material strength, the electrical connection element can enhance heat elimination via the pole of the laser diode element facing away from the substrate.

The inventive diode laser subelements can also be mounted advantageously on differently embodied carrier elements that are themselves stackable.

The invention shall be described in greater detail using the drawings in the following.

BRIEF DESCRIPTION OF THE DRAWINGS

FIG. 3b is a section through the diode laser subelement in accordance with FIG. 3a;

FIG. 5b is a section through the diode laser subelement in accordance with FIG. 5a;

FIG. 7b is a section through the diode laser component Rn in accordance with FIG. 7a;

FIG. 9a illustrates a carrier element for series connecting laterally arranged diode laser subelements;

FIG. 9b is a section through the carrier element in accordance with FIG. 9a;

FIG. 9c illustrates the carrier element in accordance with FIG. 9a with diode laser subelements arranged thereupon;

FIG. 9d is a section through the carrier element and a diode laser subelement in accordance with FIG. 9c;

FIG. 10b is a section through the arrangement in accordance with FIG. 10a.

DESCRIPTION OF THE PREFERRED EMBODIMENTS

Figure 1A:
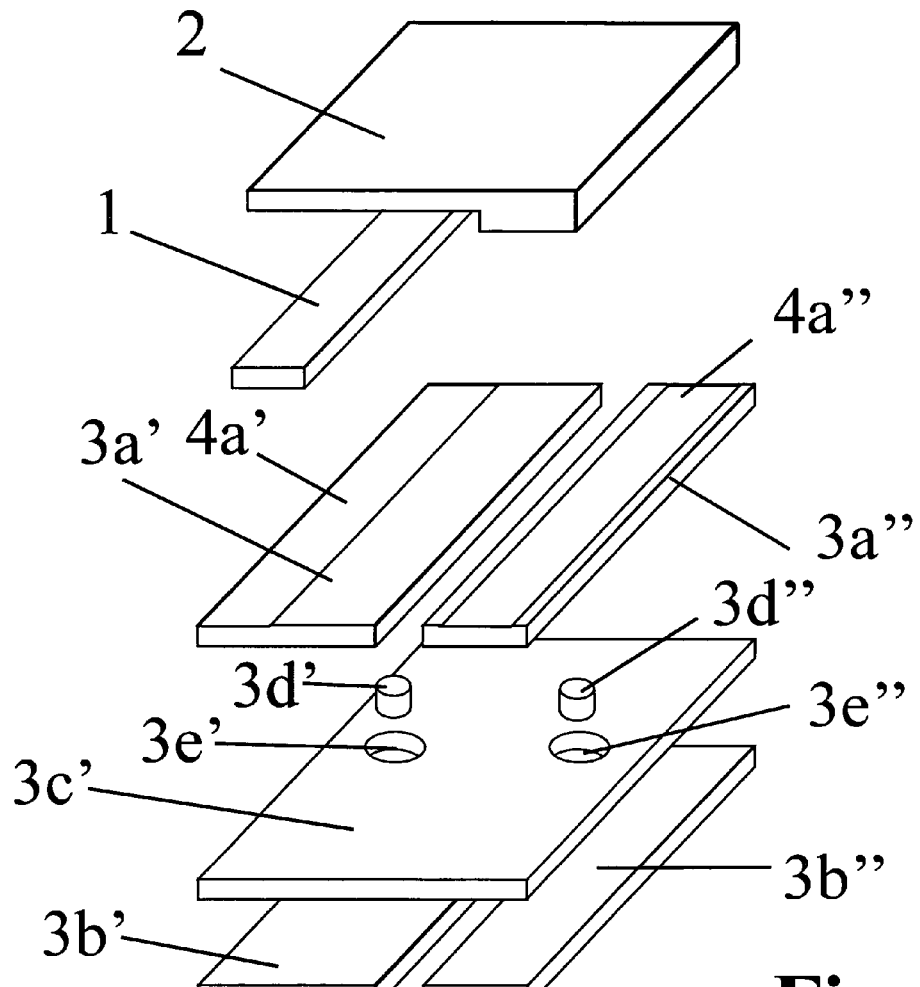
FIGS. 1a, 1a' illustrates a first embodiment of an inventive diode laser subelement.
Figure 1A:
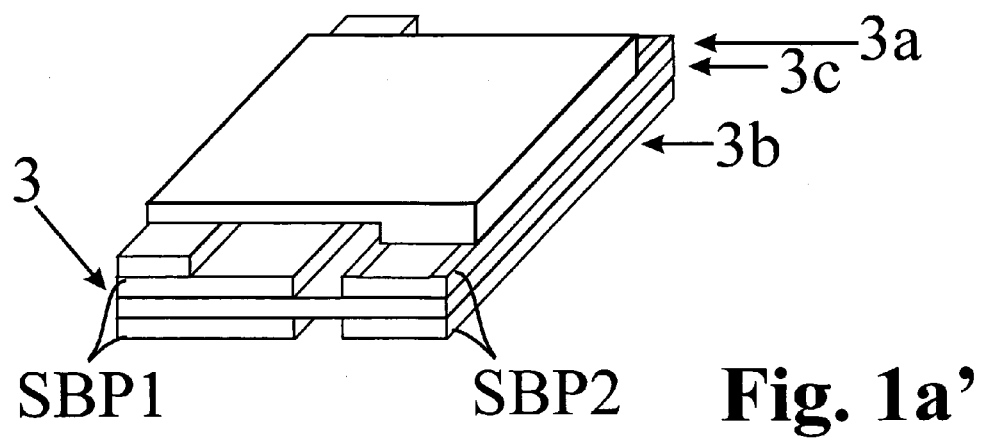
Figure 1B:
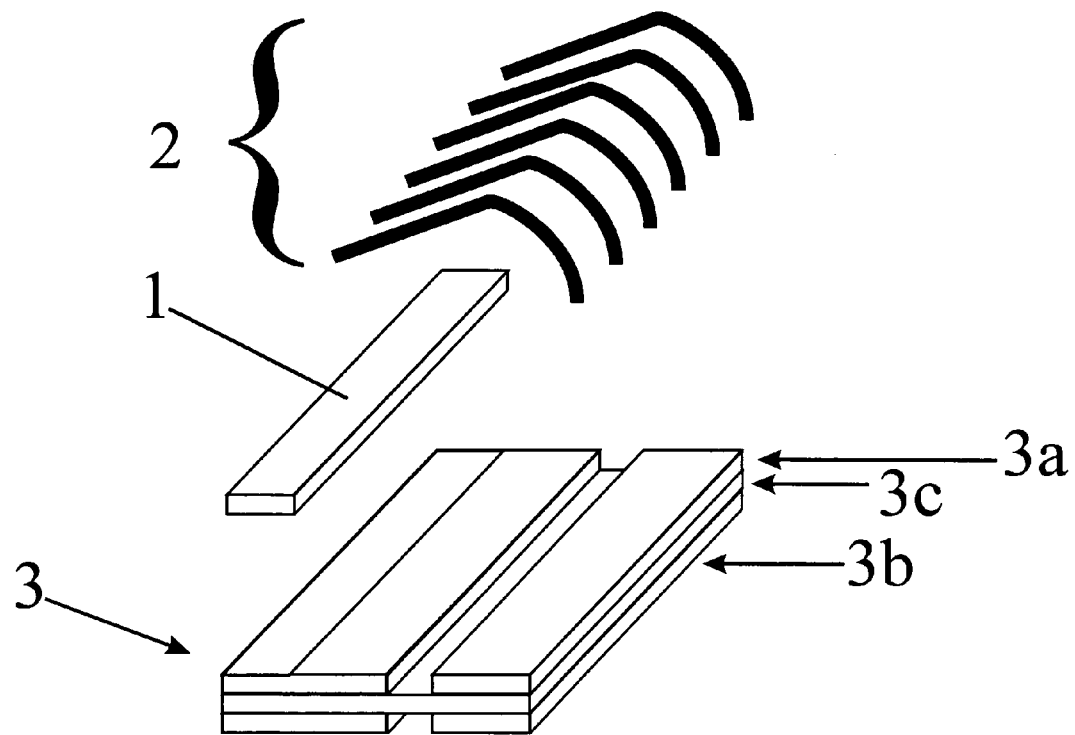
FIGS. 1b, 1b' illustrates a second embodiment of an inventive diode laser subelement.
Figure 1B:
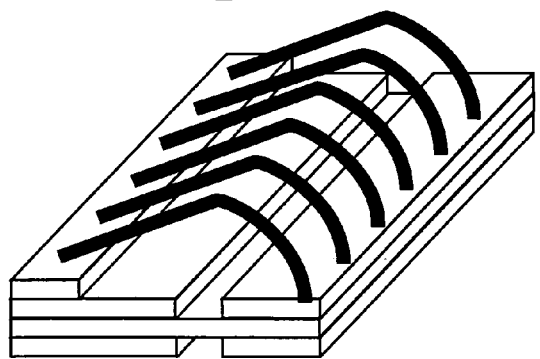

The diode laser subelement B illustrated in FIGS. 1a and 1' includes a laser diode element 1 embodied as laser diode bars, an electrically conductive connecting element 2 (metallic film), a multilayer substrate 3 that is constructed of at least three layers materially joined to one another, an upper layer 3a that is provided for mounting the laser diode element 1 and is therefore exposed, a lower layer 3b adjunct to the upper layer, and a separating layer 3c interposed therebetween. The electrically conducting connecting element 2 in this embodiment is produced from one piece, including a step for height equalization in the electrical contacting of the laser diode element 1.

The upper exposed adjunct layer 3a, 3b contain first and second metallic strata regions 3a', 3a", 3b' and 3b" arranged spaced from one another that are electrically separated from one another on each layer 3a, 3b, of which however for forming strata region pairs SBP 1 and SBP 2 each strata region 3a', 3a" of the upper layer 3a is connected electrically conducting to a strata region 3b', 3b" of the lower layer 3b. The separating layer 3c can comprise multiple strata and possesses at least one stratum 3c' made of non-metallic material.

For each of the two contact surfaces of the laser diode element 1, one of the pairs SBP 1 and SBP 2 of the electrically conducting connected strata regions 3a', 3a", 3b', and 3b" is provided for electrical contact production.

For the invention it does not matter whether the two contact surfaces of the laser diode element 1 for producing the electrical connection are in direct contact with said strata regions or are in indirect mechanical contact via intermediate elements, as long as the the [sic] inventive function is produced.

In the case of FIGS. 1a and 1a', for receiving the laser diode element 1 the multilayer substrate 3 possesses a mounting surface for a first contact surface of the laser diode element 1 (here the p contact) on the first strata region 3a' or the upper exposed layer 3a in the form of a metal-containing joint zone 4a'. Instead of a direct mechanical contact of the first contact surface of the laser diode element 1 with the first strata region 3a' via the metal-containing joint zone 4a', an inventive diode laser subelement can also be embodied by adding an electrically conducting intermediate plate between the laser diode element 1 and the strata region 3a', because the intermediate plate can be considered a component of the upper exposed layer 3a of the multilayer substrate.

The second strata region 3a" of the same layer 3a is joined via the electrical connecting element 2 and metal-containing joint zones to the second electrical contact surface of the laser diode element 1 (here the n-contact) by material joining. Of the metal-containing joint zones, the joint zone visible in FIG. 1a is labeled 4a".

Different embodiments can be used for the electrically conducting connection between the first and second metallic strata regions 3a', 3a", 3b', and 3b" of the upper and lower layers 3a and 3b, whereby an additional connecting element is not absolutely necessary, but rather the strata regions are also themselves suitable for this.

In the embodiment in accordance with FIG. 1a, through-contacting has been selected using the separating layer 3c in that electrical connections 3d' and 3d" are produced using apertures 3e' and 3e".

Without providing a complete list, the following options provide functionally equivalent electrical connecting means.

An inset stratum can be used for contacting strata regions that project over the separating layer or the strata regions can be bent with a part projecting over the separating layer, clamped to one another, and then soldered or welded.

In this context, another embodiment should be mentioned in which the strata region pairs are in a U-shape and are placed about the edge of the separating layer.

Finally, there is the option of metallizing the lateral exterior surfaces of the electrically insulating stratum in the separating layer to produce an electrical connection between the strata regions of a strata region pair. This can be done just as well by metallization on a lateral interior surface of an aperture introduced in the insulating stratum.

Without restricting the options for the structure of the electrical connection, the existence of an electrical connection between two strata regions of a strata region pair is characterized in side views of the figures (FIG. 2 through FIG. 10) by a free track 3d' or 3d" about the separating layer.

The second and third embodiments of the inventive diode laser subelements are distinguished from the embodiment in accordance with FIGS. 1a and 1a' by the structure of the electrical connecting element 2. While bonding wires are used for this in the solution in accordance with FIGS. 1b and 1b', the third embodiment in accordance with FIGS. 2 and 2' provides an electrical connecting element that is joined out of a first and a second plate-shape or film-shape part 2a and 2a', whereby the part 2a' equalizes the height. The two-part connecting element is simpler from a production engineering perspective the advantageous planar technique can be used. In contrast to this, the one-piece connecting element 2 must be embodied as a step with a precise height because of the prespecified height of the laser diode element 1.

Figure 2:
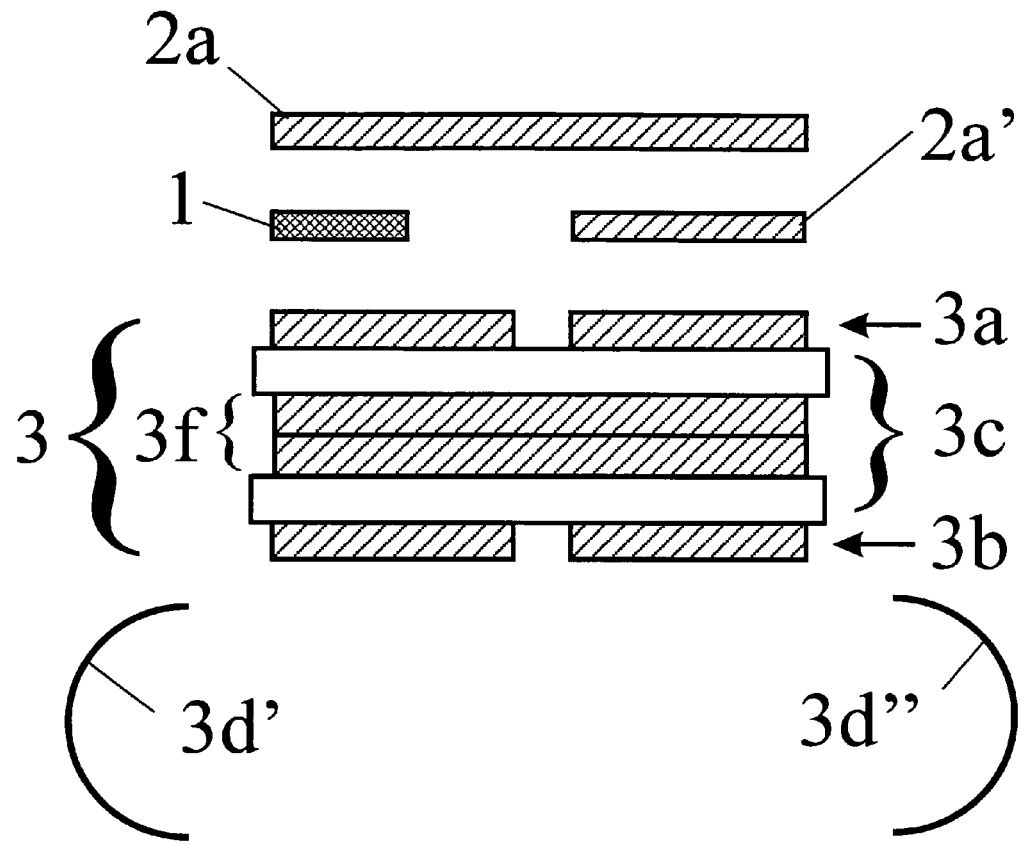
FIGS. 2, 2' illustrates a third embodiment of an inventive diode laser subelement.
Figure 2:
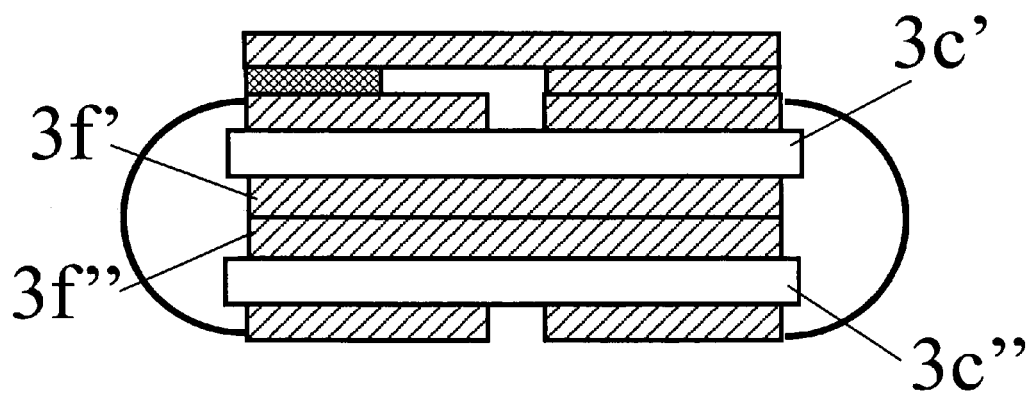

In addition, the embodiment in accordance with FIGS. 2 and 2' has a multilayer separating layer 3c with two electrically insulating non-metallic strata 3c' and 3c", between which is inserted a metallic layer 3f with two metallic strata 3f' and 3f".

Figure 3A:
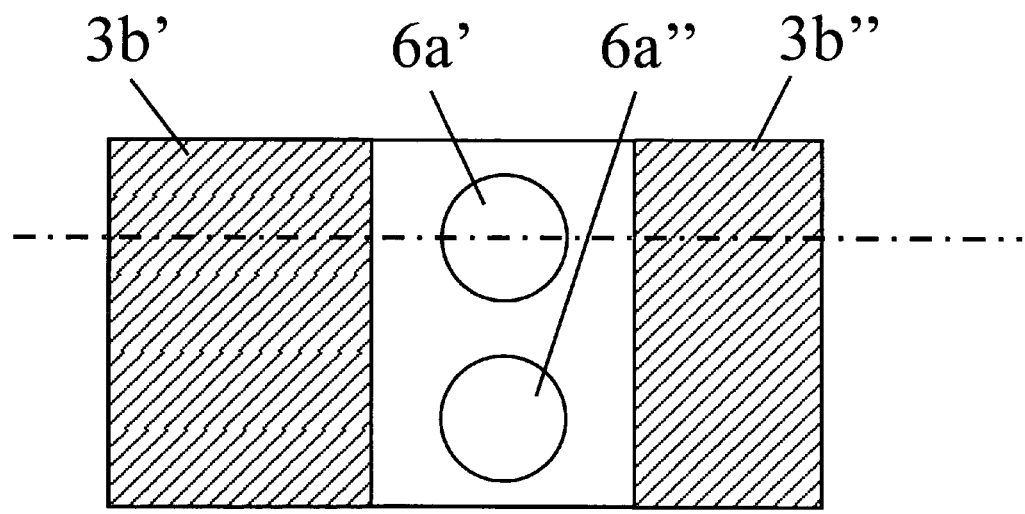
FIG. 3a illustrates a bottom view of a fourth embodiment of an inventive diode laser subelement with cooling channels and apertures for supplying and draining a coolant.
Figure 3B:
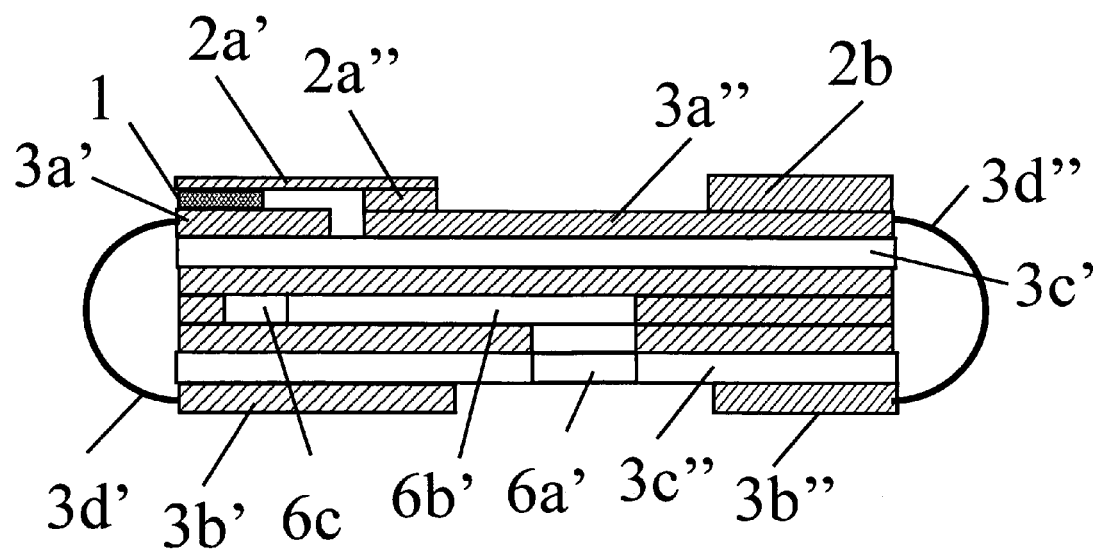

As FIGS. 3a and 3b illustrate, such an embodiment offers an option, advantageous for enhanced cooling, for introducing cooling channels into one or a plurality of metal strata 3f', 3f", . . . , which can be supplied with a coolant using lateral apertures in the metallic layer 3f or using cutouts 6a' and 6a" in one of the non-metallic strata (the lower stratum in the case of FIGS. 3a and 3b). Introducing channels 6c that are in the region of the multilayer substrate and that can be supplied with a coolant via channels of the type 6b' from the supply and drain 6a' and 6a" and that are electrically insulated from the power supply for the laser diode element 1 makes it possible when this diode laser subelement is operating and in particular when there is electrical series connection thereof to prevent electrical voltage from being applied to components that conduct coolant, which otherwise could over time could lead to damaging electrochemical effects on the component. At this point it should be mentioned that cooling channels with corresponding apertures for supplying and draining can be introduced into the electrically insulating stratum 3c' of the diode laser subelement in accordance with FIGS. 1a, 1a', 1b and 1b', as well. The same also applies for a plurality of strata of type 3c' (3c", etc.) for the case in which one separating layer comprises only electrically insulating strata 3c', 3c", etc.

Figure 4A:
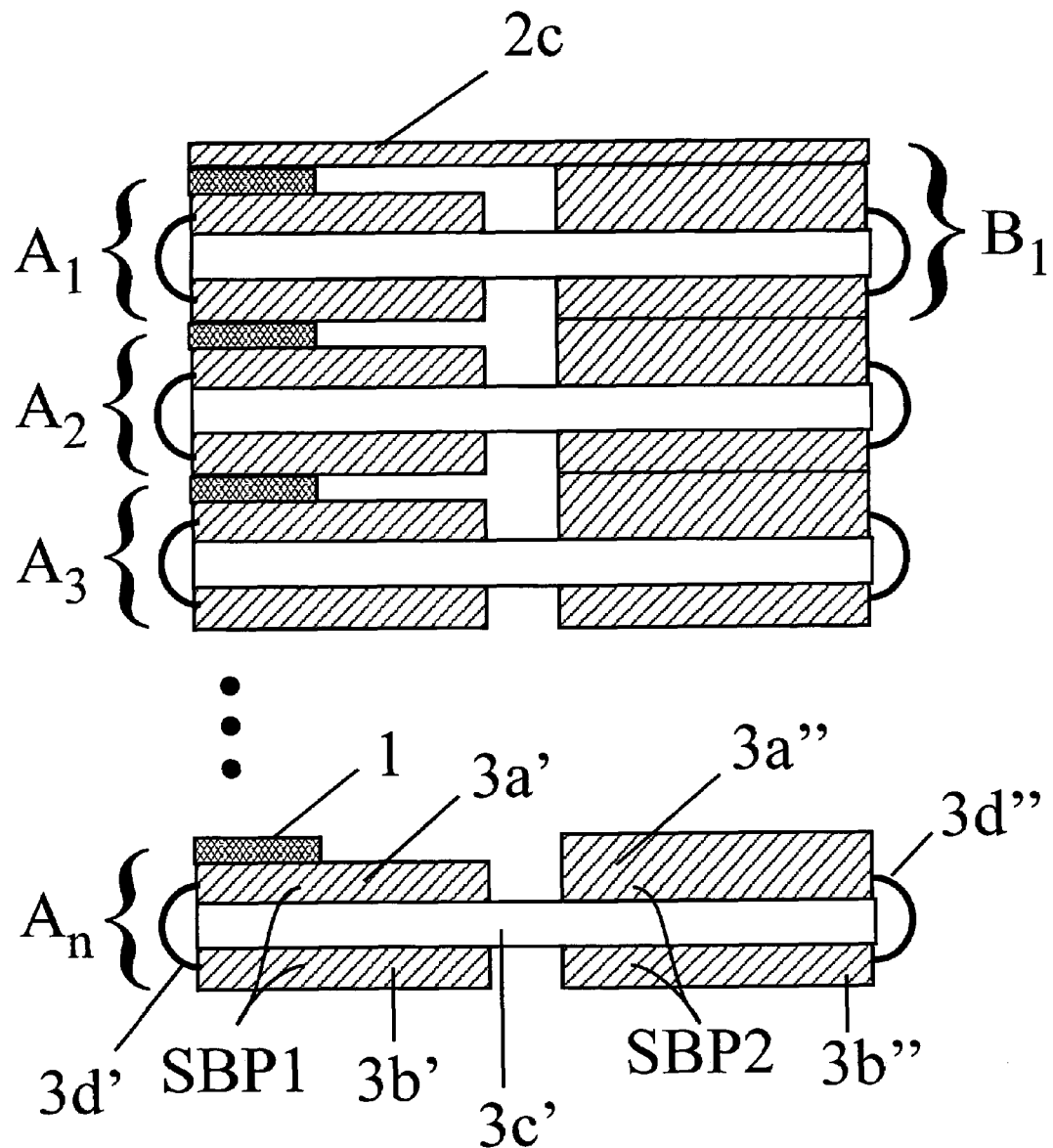
FIG. 4a illustrates a first embodiment of a surface-mountable diode laser stack comprising diode laser subelements.

With the invention, diode laser stacks with low production complexity in accordance with FIG. 4a can be built in that, by stacking, the first strata region pairs SBP 1, which contain the mounting surface for the first electrical contact to the laser diode element 1, are electrically connected via the second electrical contact of the laser diode element 1, and in this case it is a direct connection. With one exception, a subgroup $A_1$ of the diode laser subelement $B_1$ in which the electrical connecting element 2c is missing is used for the structure.

The exception relates to the uppermost element limiting the stack and depicted in FIG. 4a, in which the second electrical contact of the laser diode element 1 remaining free in the stack is connected to the second strata region pair SBP 2 using the electrical connecting element 2c. The second strata region pairs SBP 2 are also electrically connected using the stack.

It should be noted that a similar inventive stack of diode laser subelements can be embodied with such in accordance with FIGS. 2 and 2' when the electrical connecting element 2a' between two diode laser subelements is omitted.

Figure 4B:
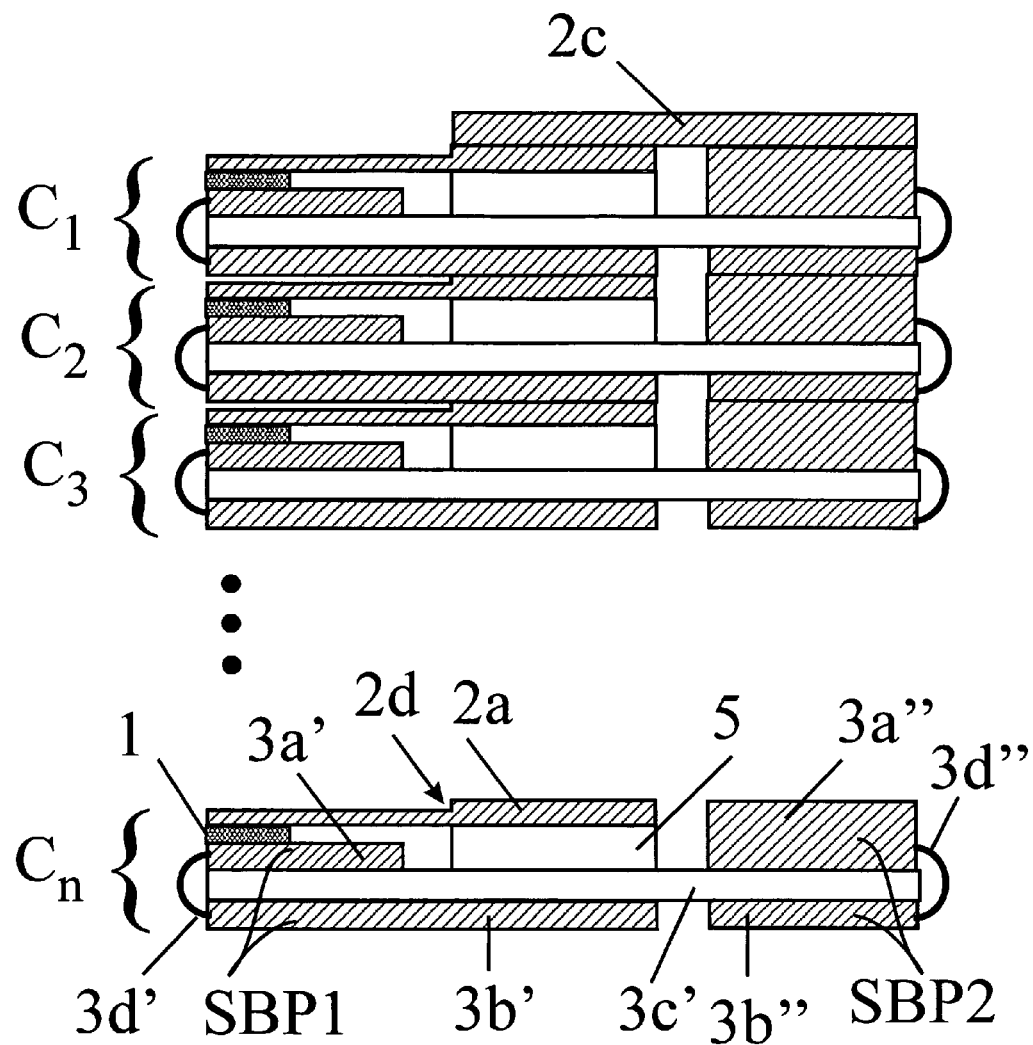
FIG. 4b illustrates a second embodiment for a surface-mountable diode laser stack, comprising diode laser subelements.

A second embodiment of a surface-mountable diode laser stack in accordance with FIG. 4b constitutes partial elements $C_n$, in which attached on the separating layer 3c is a spacer 5 upon which there is an electrical connecting element 2a that is connected to the second electrical contact of the laser diode element 1. The stacking occurs as in the first embodiment in accordance with FIG. 4a, but with the difference that the electrical connection from the second electrical contact of the laser diode element 1 to an adjacent first strata region pair SBP 1 is produced indirectly via the electrical connecting element 2a. The connecting element 2a is provided with a step 2d that during stacking of the diode laser subelements prevents an upper element from exerting direct pressure on the laser diode element 1 of a lower element.

It should be noted that the diode laser subelements with cooling channels in accordance with FIGS. 3a and 3b can also be arranged in a similar manner in a diode laser stack if only the element 2a", which in FIG. 3b produces the electrical connection to the strata region 3a", is embodied as electrical insulator and a through aperture flush to the supplies/drains present in FIGS. 3a and 3b is produced using the diode laser subelement such that the formation of a rise and fall line is enabled in the stack through all diode laser subelements. Corresponding terminal elements on the uppermost diode laser subelement of the stack close the rise and fall line and produce the electrical contact between the laser diode element and the strata region 3a".

Figure 5A:
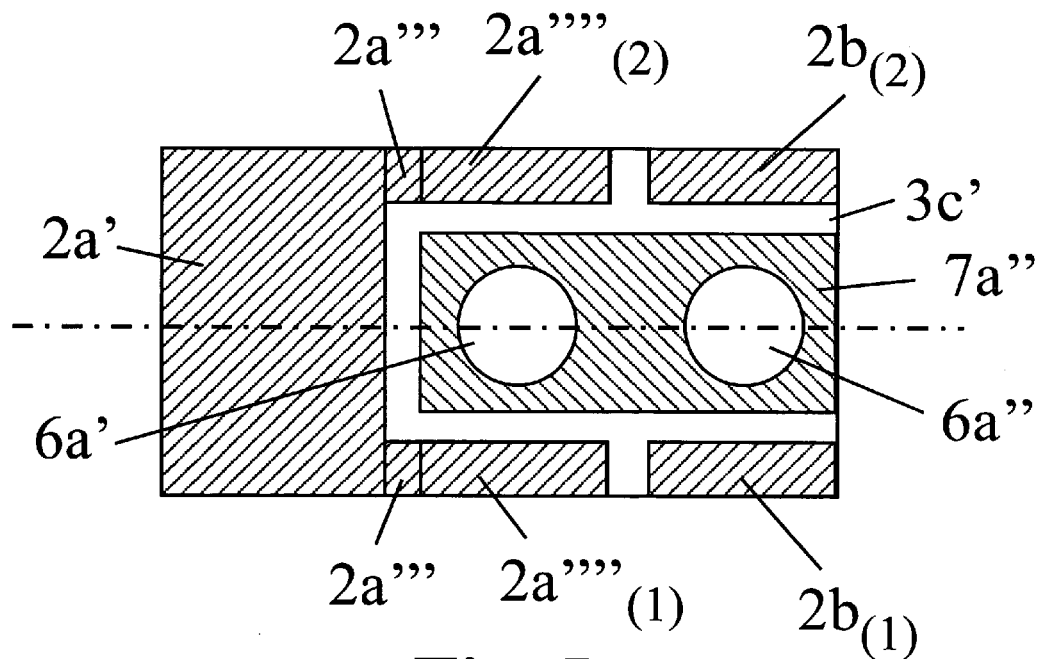
FIG. 5a is a top view of a fifth embodiment of a diode laser subelement, identified as Type D, that is suitable for stacking and that contains cooling channels.
Figure 5B:
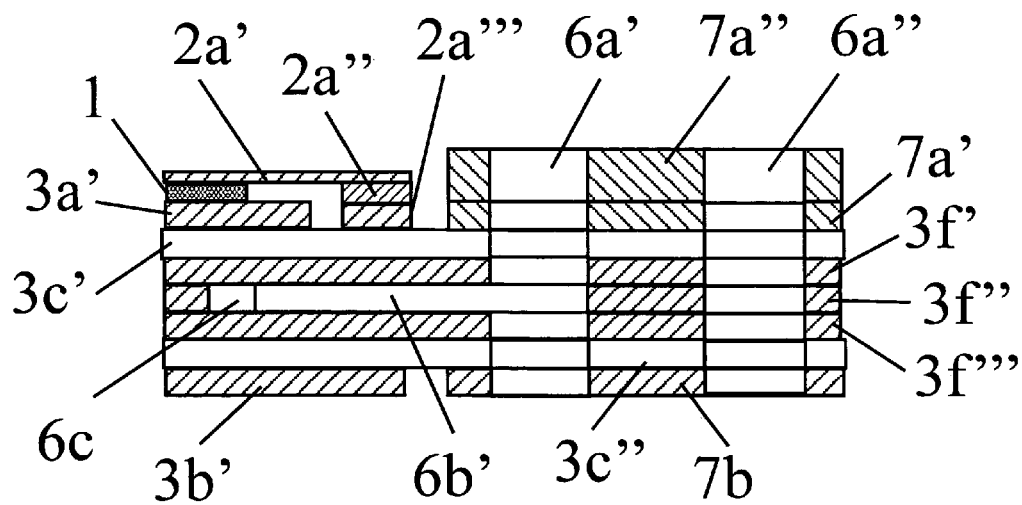
Figure 5C:
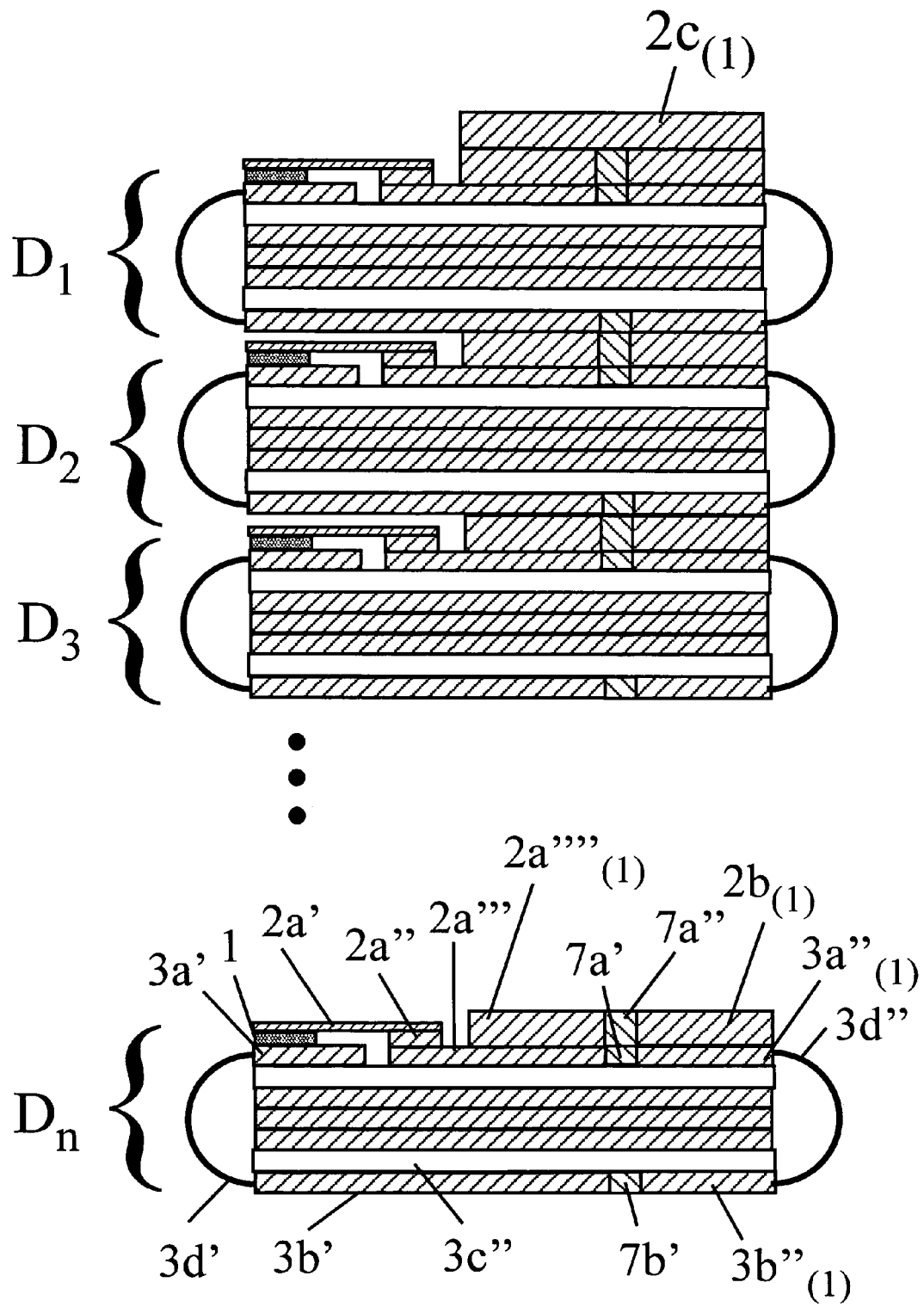
FIG. 5c is a side view of a third embodiment of a surface-mountable diode laser stack comprising diode laser subelements in accordance with FIGS. 5a and 5b.

FIGS. 5a through 5c illustrate one preferred further development of a diode laser stack made of diode laser subelements with cooling channels. In contrast to diode laser subelements of type C, in which a positive (pull) or negative (pressure) shear strain can be exerted via the electrical connecting element 2a in a stack in accordance with FIG. 4b, in the diode laser subelement in accordance with FIGS. 5a and 5b strain relief for the electrical connecting element 2a' occurs using additional electrical connecting elements 2a" and 2a''' embodied as metallic strata elements, whereby the strata element 2a''' embodied in a U-shape is affixed in a material fit to the multilayer substrate.

For overcoming the difference in height in a stack of diode laser subelements and for electrical contacting of a diode laser subelement of the same type situated thereover, in accordance with FIG. 5c metallic strata elements $2a''''_{(1)}$, $2a''''_{(2)}$, $2b_{(1)}$, and $2b_{(2)}$ are used.

Metallic strata elements 7a' and 7b on the upper and lower sides of the multilayer substrate are electrically insulated from the metallic strata elements, which during operation conduct the electrical current and in conjunction with the strata element 7a" overcome the difference in height in the stack and embody a riser in the hydraulic connection of the apertures 6a' and 6a" of two diode laser subelements that are one above the other. In a stack, this riser must be closed on the uppermost diode laser subelement by an additional terminal element.

In this embodiment, two elements $2c_{(1)}$ and $2c_{(2)}$ (hidden) produce the electrical connection between the strata elements $2a''''_{(1)}$ and $2b_{(1)}$ or $2a''''_{(2)}$ and $2b_{(2)}$ in the uppermost diode laser subelement of the stack.

In addition, the one strata region pair that does not carry the laser diode element 1 is embodied twice with its electrical connections, whereby in FIG. 5c only a portion of the strata regions $3a''_{(1)}$ and $3b''_{(1)}$ is visible. The other part of the strata regions, which is situated symmetrically on the opposing side of the diode laser subelement, is hidden in this side view.

Figure 6A:
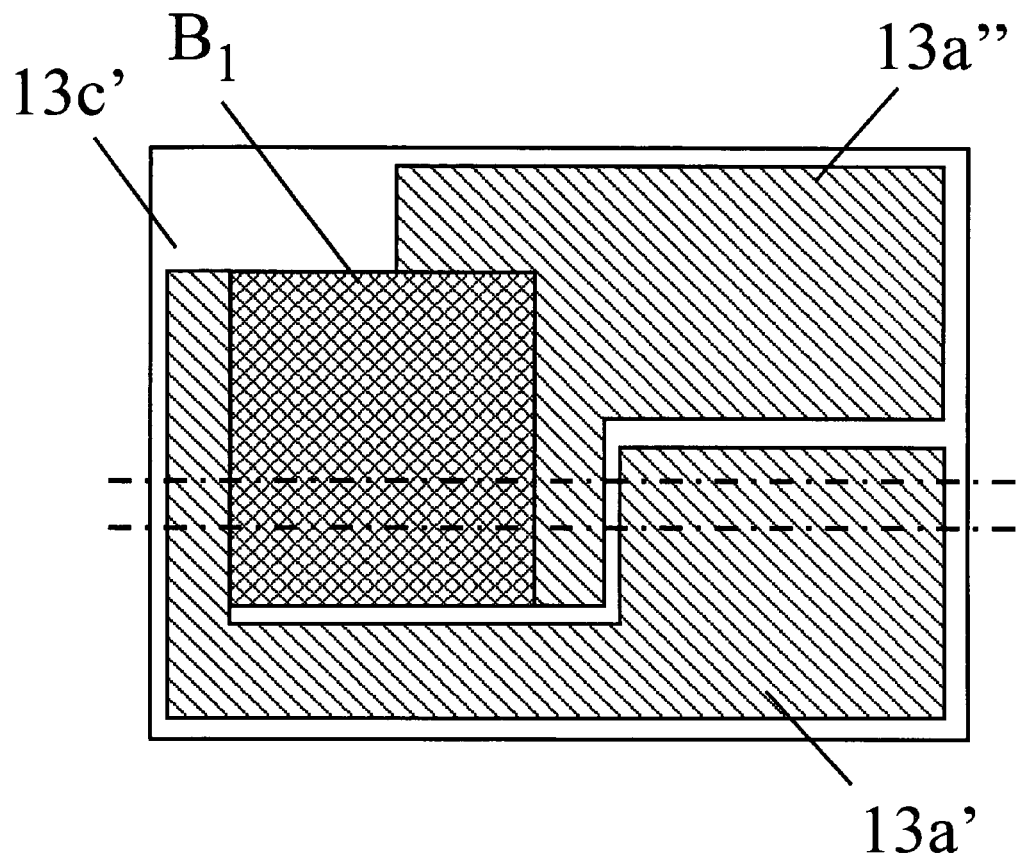
FIG. 6a is a top view of a diode laser component with a diode laser subelement on a carrier element and electrical contacting from above.
Figure 6B:
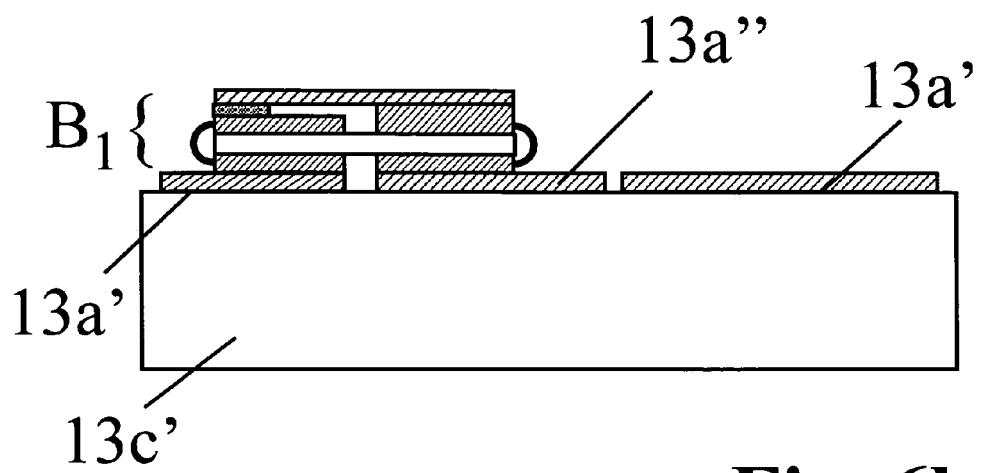
FIG. 6b is a section through the diode laser component in accordance with FIG. 6a with a diode laser subelement on a carrier element and electrical contacting from above.

In accordance with FIG. 6, the diode laser subelements $B_1$ can be advantageously mounted on a carrier element that has at least two materially joined layers, of which a first upper layer carries spaced metallic strata 13a' and 13a" that are electrically separate from one another, and a second separating layer 13c adjacent to the upper layer possesses at least one stratum 13c' made of a non-metallic material. The diode laser subelement $B_1$ with its strata region pairs SBP1 and SBP2 is in electrical contact with the metallic strata 13a' and 13a" via at least one stratum made of a non-metallic material using a force fit or a positive fit.

Figure 7A:
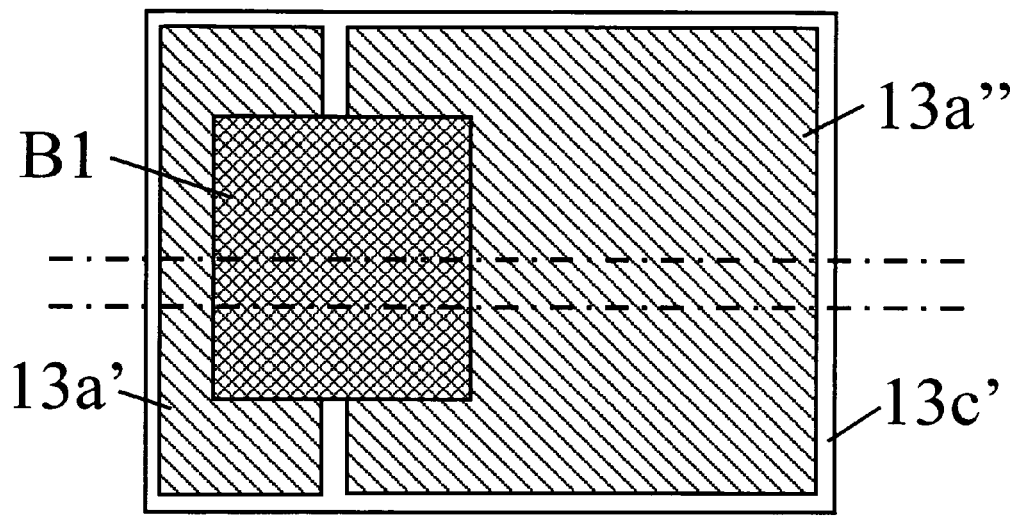
FIG. 7a is a top view of a diode laser component $R_n$ that contains a diode laser subelement on a carrier element with electrical contacting from above.
Figure 7B:
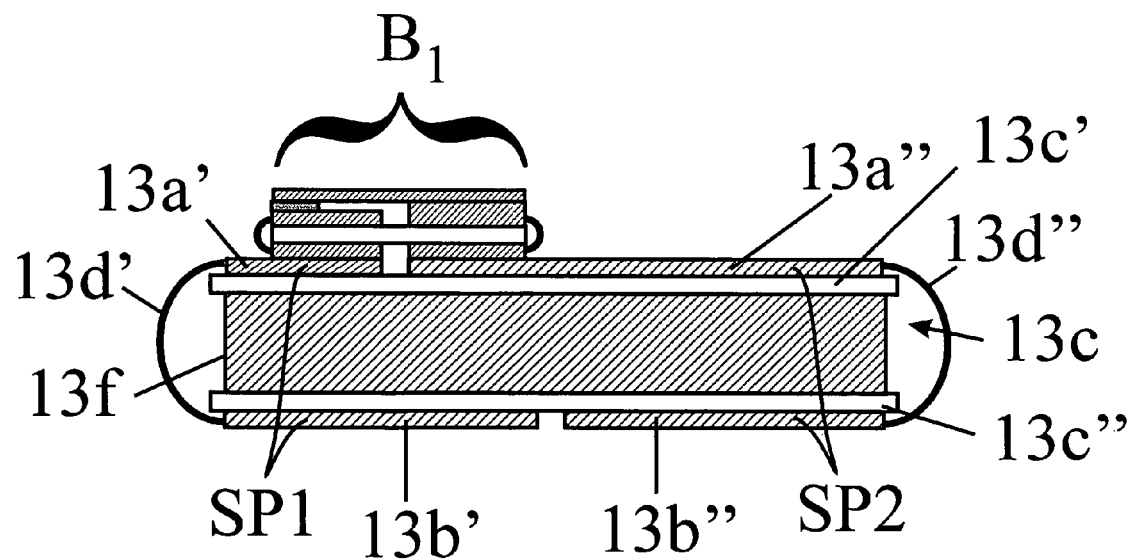

In the embodiment in accordance with FIG. 7, the carrier element is largely distinguished from the embodiment in accordance with FIG. 6 by a third lower layer, that is adjacent to the upper layer and opposes the separating layer, which possesses another metallic layer 13f. The third layer contains first and second metallic strata 13b' and 13b" that are electrically separated from one another. The first metallic strata 13a' and 13b', as well as the second metallic strata 13a" and 13b" are connected to one another electrically conducting for forming strata pairs SP1 and SP2 via connecting elements 13d' and 13d".

The use of the addressed surface mounting of the multilayer substrate on the carrier element is advantageous in this inventive solution, whereby the electrical contacting of the diode laser subelement occurs via the lower side of the substrate. When needed, additional diode laser subelements can be mounted on the carrier elements, and their electrical contacting can also occur as series connection with the metallic strata embodied as tracks.

Figure 8:
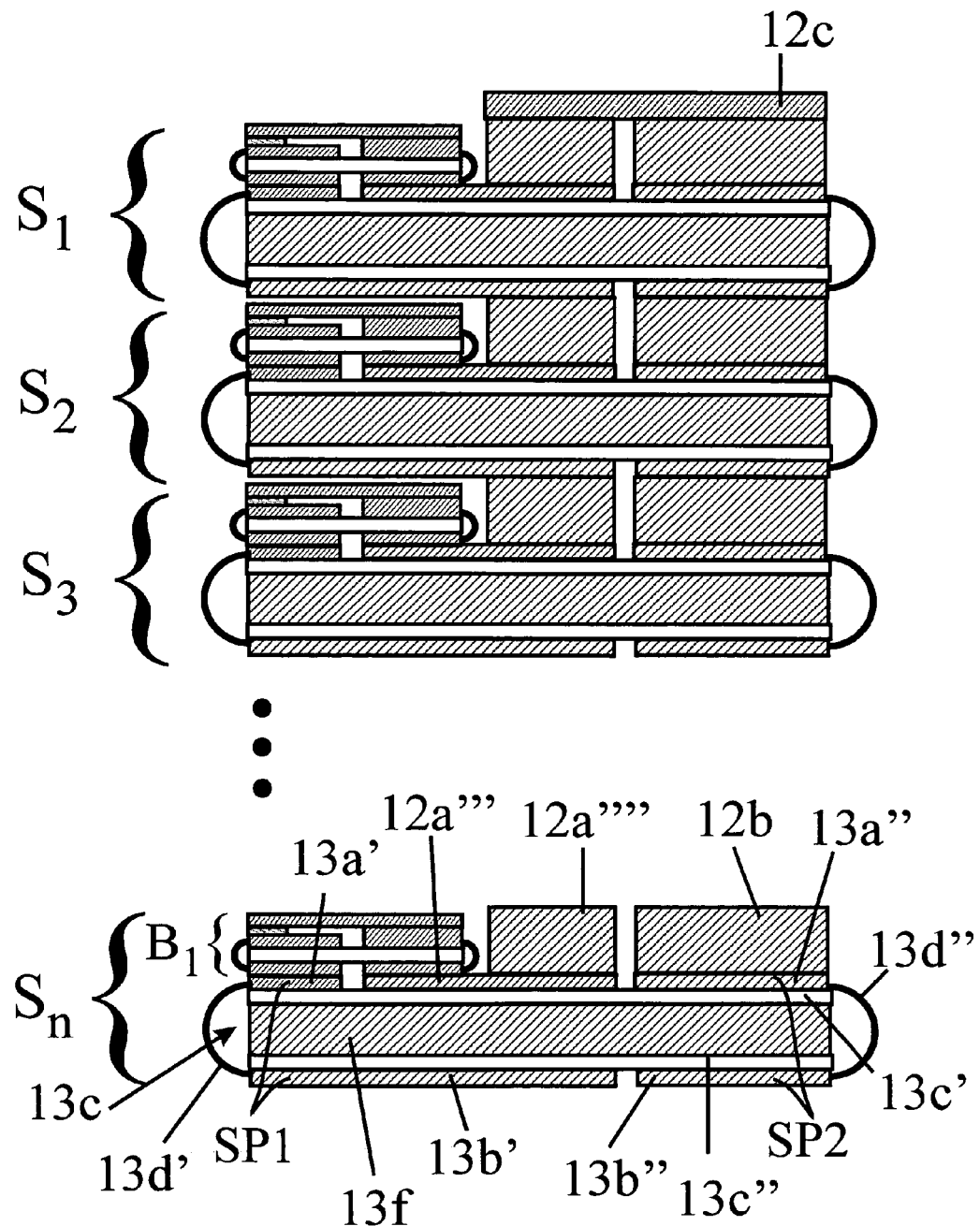
FIG. 8 is a stack made of an additional embodiment of diode laser components.
Figure 10A:
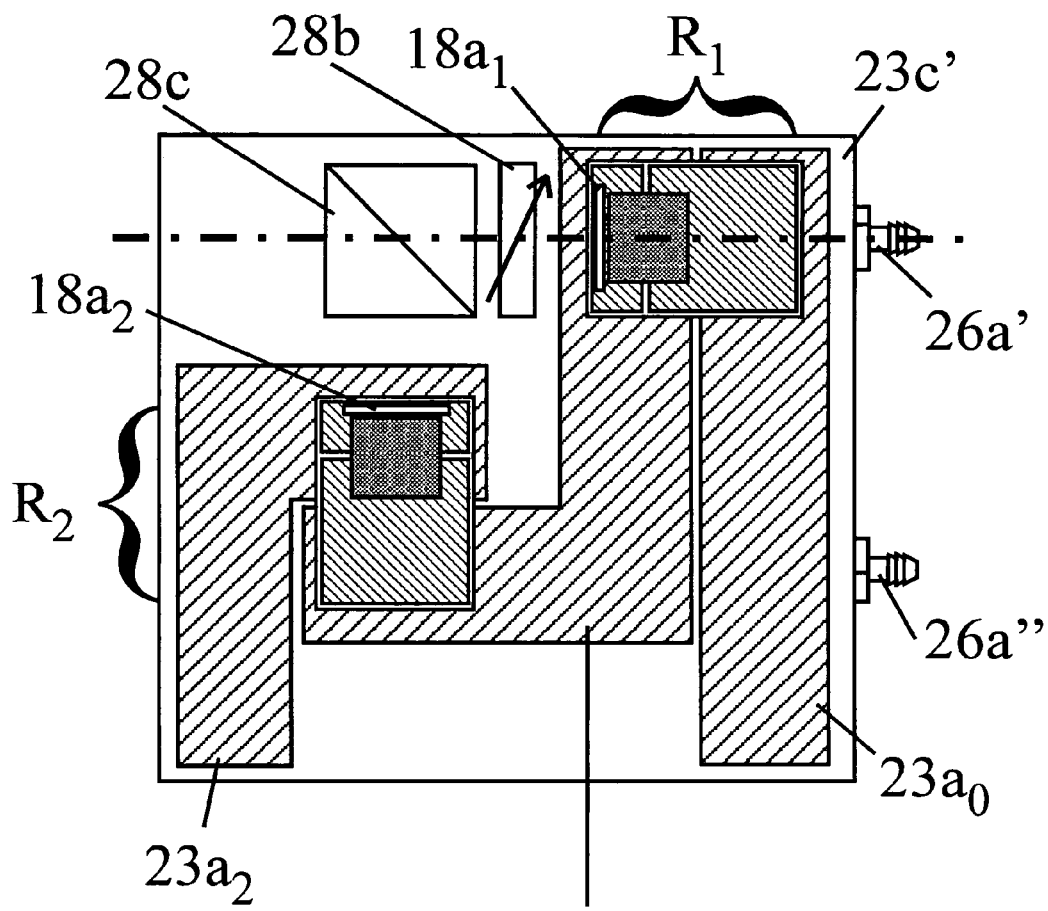
FIG. 10a is a top view of another embodiment of a carrier element for one or a plurality of diode laser components.
Figure 10B:
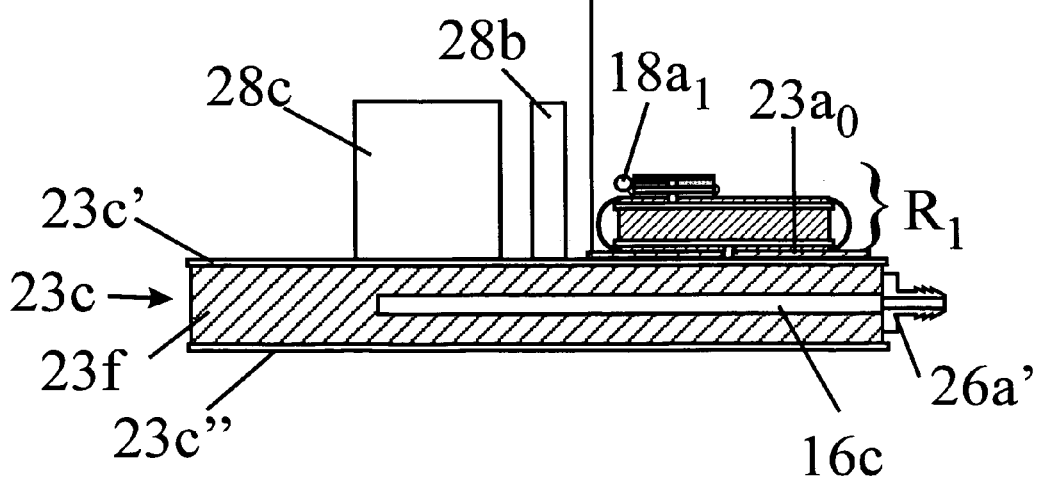

For stacking diode laser elements in accordance with FIG. 8, another modified structure $S_n$ is used in which on the upper layer of the carrier element, which receives the component $B_1$, an additional spaced third metallic stratum 12a"" that is electrically separated from the first and the second metallic strata 13a' and 13a" is provided for an electrically conducting connecting element 12a"". An additional electrically conducting connecting element 12b is provided on the second metallic stratum 13a".

The first metallic stratum 13a', on which the strata region pair SBP1 is attached to the laser diode element 1, and the second metallic stratum 13a", for forming strata pairs SP1 and SP2, are connected electrically conducting to first and second metallic strata 13b' and 13b", which are electrically separated from one another, of a third, lower layer by connecting elements 13d' and 13d".

Once stacked, between adjacent carrier components $S_n$ there are electrical connections between the first metallic stratum 13b' in the lower layer with the connecting layer 12a"" on the upper layer and between the connecting element 12b on the upper layer and the second metallic stratum 13b" in the lower layer.

The two remaining free electrical conducting connecting elements 12a"" and 12b of the carrier structure $S_1$ limiting the stack are electrically connected to one another by a bridge 12c so that the current can be conducted on through the entire stack.

At this point it should be mentioned that an additional advantageous embodiment of diode laser stacks similar to that in FIG. 8 comprises using carrier elements as diode laser components that have cooling channels analogous to the diode laser subelements in FIGS. 5a through 5c and stack them in an analogous manner.

In the carrier element illustrated in FIGS. 9a-9d, interposed between non-metallic strata 13c', 13c" is a metallic layer 13f through which passes a structure for conducting coolant. Coolant is supplied and drained via hose nipples $16a'$ and $16a''$. A supply channel for the coolant is labeled $16b'$ and a drain channel is labeled $16b''$. A coolant distribution structure $16c$ comprises periodic recesses in the material of the metallic layer $13f$.

For series connection of diode laser subelements $B_n$, the two strata region pairs for each diode laser subelement need only be brought into electrical contact with the electrically separated metallic strata $13a_n$, whereby the metallic stratum $13a_0$ is for electrical contacting of a first and the metallic stratum $13a_n$ is for electrical contacting of a last diode laser subelement $B_n$ to be switched in series.

In the carrier element illustrated in FIGS. $10a$ and $10b$, disposed between two non-metallic strata $23c'$ and $23c''$ of a separating layer $23c$ is a metallic layer $23f$ through which passes a coolant distribution structure $16c$. Coolant is supplied and drained via hose nipples $26a'$ and $26a''$.

Metallic strata $23a_n$ that are electrically separated from one another provide series connection of diode laser components $R_n$, whereby the metallic stratum $23a_0$ is provided for electrically contacting a first and the metallic stratum $23a_n$ (here: $23a_2$) is provided for electrically contacting a last n diode laser component $R_n$ to be switched in series and to be laterally arranged.

The two diode laser components $R_1$ and $R_2$, which are oriented perpendicular to one another in terms of their direction of radiation, have a structure as was already described using FIG. 7, whereby both diode laser components $R_1$ und $R_2$ have beam-forming collimation lenses or collimation lens arrangements $18a_1$ und $18a_2$.

The separating layer $23c$ also receives a lambda/2-plate $28b$ for rotating by 90° the polarization plane of emitted laser radiation of the diode laser component $R_1$ and a polarization beam distributor $28c$ for overlaying the differently polarized laser beam bundles from the two diode laser components $R_1$ and $R_2$.

The invention claimed is:

1. A diode laser subelement, comprising:
a heat-distributing multilayer substrate including an upper layer, a lower layer, and at least one separating layer interposed between said upper layer and said lower layer, said upper layer, said lower layer and said at least one separating layer being materially joined to one another, said upper and said lower layers including metallic strata regions arranged as being spaced from one another so as to form strata region pairs, each of said strata regions of said upper layer being connected electrically conducting to a corresponding one of said strata regions of said lower layer, said at least one separating layer having at least one electrically insulating stratum made of non-metallic material; and
at least one laser diode element being applied to a mounting surface of said heat-distributing multilayer substrate, a sum of thicknesses of metallic strata in the multilayer substrate exceeding a sum of thicknesses of the electrically insulating non-metallic strata at least in a partial region perpendicular to the mounting surface.

2. A diode laser subelement in accordance with claim 1, further comprising different pairs of electrically conducting connected strata regions for producing electrical contacts to said at least one laser diode element.

3. A diode laser subelement in accordance with claim 2, wherein a first strata region of a one of said strata region pairs contains the mounting surface as a metal-containing joint zone for a first contact surface of said laser diode element and a second strata region of said one of said strata region pairs of the same layer is connected via an electrical connecting element to a second contact surface of said laser diode element.

4. A diode laser subelement in accordance with claim 3, wherein said electrical connecting element, which is in electrical contact with said second strata region, is materially joined to a first contact surface via at least one metal-containing joint zone to the second electrical contact surface of said laser diode element.

5. A diode laser subelement in accordance with claim 4, wherein said electrical connecting element for connecting to said second strata region has a second contact surface that is materially joined to said second strata region via at least one metal-containing joint zone.

6. A diode laser subelement in accordance with claim 5, wherein said electrical connecting element including a first and a second plate-shape or film-shape part joined with one another.

7. A diode laser subelement in accordance with claim 1 wherein said metallic strata regions have mean linear thermal expansion coefficients that are greater than those of said laser diode element, and the mean linear thermal expansion coefficient of the non-metallic material of said separating layer at room temperature is lower than that of said laser diode element.

8. A diode laser subelement in accordance with claim 1, wherein said separating layer includes two electrically insulating strata and a metallic layer which is disposed between said two electrically insulating strata.

9. A diode laser subelement in accordance with claim 8, wherein said metallic layer comprises a plurality of strata, of which at least one stratum contains cooling channels for a coolant.

10. A diode laser subelement in accordance with claim 1, wherein a first strata region of a one of said strata region pairs contains said mounting surface for a first contact surface of said laser diode element, and provided on said upper layer is an additional spaced third metallic strata region and that is connected to a second contact surface of said laser diode element via an electrical connecting element.

11. A stack of diode laser subelements comprising at least two of the diode laser subelements in accordance with claim 10, wherein through stacking between adjacent diode laser subelements electrical connections exist between said first metallic strata region on said lower layer and said third strata region of said upper layer and between said second metallic strata region on said upper layer and said second metallic strata region on said lower layer, and in that said remaining free second and third metallic strata regions of said diode laser subelement limiting said stack are electrically connected to one another.

12. A stack of diode laser subelements comprising at least two diode laser subelements in accordance with claim 1, wherein, through stacking, first strata region pairs of said diode laser subelements, which includes the mounting surface for the first electrical contact to said laser diode element, are directly or indirectly electrically connected via the second electrical contact of said laser diode element, up to one free-remaining second electrical contact of said laser diode element of a diode laser subelement limiting said stack, from which a connection to a second strata region pair of said diode laser subelement limiting said stack exists through an electrical connecting element, and said second strata region pairs of all diode laser subelements are electrically connected by the stacking.

13. A diode laser component with at least one diode laser subelement in accordance with claim 1, wherein said at least one diode laser subelement with its strata region pairs is brought into contact with spaced first and second metallic strata, are electrically separated from one another, on a carrier element that has at least two layers materially joined to one another, of which a first upper layer includes the metallic strata and a second separating layer adjacent to said upper layer possesses at least one stratum made of a non-metallic material.

14. A diode laser component in accordance with claim 13, wherein the contact between said strata region pairs and said first and second metallic strata is produced by a force fit.

15. A diode laser component in accordance with claim 13, wherein at least one metal-containing joint zone is provided for each of the contacts between said strata region pairs and said first and second metallic strata that is provided by a material-engaged contact formation.

16. A diode laser component in accordance with claim 13, wherein said first and second metallic strata of said upper layer of said carrier element are electrically conductively connected, for forming strata pairs, with spaced first and second metallic strata of a third lower layer which are electrically separated from one another, whereby said third layer is adjacent to said second separating layer and opposes said upper layer.

17. A diode laser component comprising at least one diode laser subelement in accordance with claim 1, wherein:
    said diode laser subelement is applied to a carrier element made of layers materially joined to one another;
    a first upper layer includes spaced first, second and third metallic strata that are electrically separated from one another;
    said first and a third metallic strata are brought into electrical contact with the strata region pairs;
    a second separating layer adjacent to said upper layer possesses at least one stratum made of non-metallic material; and
    said first metallic stratum, on which said strata region pair is attached with said laser diode element and a second metallic stratum without electrical contact is connected electrically conducing to one of said strata region pairs are for forming strata pairs with spaced first and second metallic strata, that are electrically separated from one another, of a third lower layer, whereby said third layer is adjacent to said upper layer and opposes said second layer.

18. A stack of diode laser components, comprising at least two of the diode laser components in accordance with claim 17 connected in series, wherein, through stacking:
    electrical connections exist between adjacent carrier elements between said first metallic stratum on said third, lower layer with said third metallic stratum on said first, upper layer and between said second metallic stratum on said first, upper layer and said second metallic stratum on said third, lower layer; and
    said remaining free second and said remaining free third metallic strata of said carrier element limiting said stack are electrically connected to one another.

19. A lateral arrangement of diode laser components comprising at least two of the diode laser components in accordance with claim 13, wherein, by contacting said strata region pairs with spaced metallic strata that are electrically separated from one another, diode laser subelements are connected in series on said carrier.

20. An arrangement of diode laser components comprising at least two of the diode laser components in accordance with claim 13, wherein said strata pairs are brought into contact with spaced first and second metallic strata, that are electrically separated from one another, on another carrier element that has at least two layers that are materially joined to one another, of which a first upper layer includes said metallic strata and a second separating layer adjacent to said upper layer possesses at least one stratum made of a non-metallic material.

21. An arrangement in accordance with claim 20, wherein optical components for changing the radiation properties of said diode laser components are arranged on said other carrier element.

22. An arrangement in accordance with claim 20, wherein said separating layer contains a metallic layer between two electrically insulating non-metallic strata.

23. An arrangement in accordance with claim 22, wherein a structure for conducting coolant passes through said metallic layer.

* * * * *